United States Patent [19]

Romania et al.

[11] 4,033,032

[45] July 5, 1977

[54] INTEGRATED CIRCUIT PACKAGE REMOVAL TOOL

[75] Inventors: Samuel Richard Romania; George Joseph Sprenkle, both of Phoenixville, Pa.

[73] Assignee: Burroughs Corporation, Detroit, Mich.

[22] Filed: Dec. 16, 1976

[21] Appl. No.: 751,176

[52] U.S. Cl. .................................. 29/764; 29/235; 29/278

[51] Int. Cl.[2] .................. H01R 43/00; H05K 13/04

[58] Field of Search ............ 29/764, 739, 740, 741, 29/758, 235, 278; 81/3 R

[56] References Cited

UNITED STATES PATENTS 3,443,297 5/1969 Lusby, Jr. ............................ 29/764
3,974,556 8/1976 Kubik .................................. 29/764

*Primary Examiner*—Carl E. Hall
*Attorney, Agent, or Firm*—Francis A. Varallo; Edmund M. Chung; Kevin R. Peterson

[57] ABSTRACT

An extraction tool is described for use with integrated circuit (IC) packages of the type having a metallic heat sink member fused to the chip-enclosing ceramic body. The tool finds particular application in connection with a patented high package density island configuration wherein each IC package is secured on a retention post of a connector which is mounted between, and in close proximity to, adjacent parallel sections of the island cooling frame. The IC package heat sink member has at least one integral extension adapted to contact the frame. In performing its removal function, the present tool is capable of gripping opposite edges of the heat sink member in the limited space between the connector and cooling frame section. Having engaged the heat sink, the tool now permits the initial application of opposing forces respectively to the heat sink and the connector retention post. Finally, the opposing forces are directed upon the heat sink member itself, to provide the firm grasp needed for removal of the package from the connector.

7 Claims, 4 Drawing Figures

INTEGRATED CIRCUIT PACKAGE REMOVAL TOOL

CROSS REFERENCE TO RELATED APPLICATION

The IC removal tool of the present invention finds particular application in the high density packaging system described and claimed in application Ser. No. 513,283, which issued as U.S. Pat. No. 3,946,276 in the names of Robert E. Braun et al and is entitled "Island Assembly Employing Cooling means for High Density Integrated Circuit Packaging". This patent is assigned to the same assignee as the present application.

BACKGROUND OF THE INVENTION

In the reference patent there is described and claimed a system which provides for high density packaging of electronics equipment in an island configuration. Integrated circuit packages of the "leadless" variety, each having a heat sink member with at least one integral extension at an extremity thereof, are installed in receptacles or connectors. The package is located in the connector by means of a registration hole in the heat sink and a retention post within the connector. The connectors themselves are mounted on an interconnection medium and lie between, and in close proximity to, adjacent parallel sections of a cooling frame fastened to the interconnection medium. When installed in the connector, the IC package heat sink extension contacts the cooling frame section.

The insertion of the IC package into the connector via its retention post is readily accomplished without the aid of tools. However, even though the heat sink member extends beyond the connector body, the surrounding structure in a fully assembled island and the extremely narrow aperture between the connector and the cooling frame sections make it virtually impossible to extract the package from the connector without the aid of a tool.

The proliferation of integrated circuits has resulted in the development of a number of IC package extraction tools. These tools vary appreciably in their design to make them applicable to the variety of IC packages being produced and the manner in which they are mounted for operation. "Leadless" IC packages are generally side, edge or face mounted in suitable connectors. Dual inline packages (DIP) are generally of the "leaded" type characterized by two rows of external connecting leads which are inserted into a printed circuit board. An example of a tool for removing the latter type of IC packages from a circuit board is found in U.S. Pat. No. 3,974,556, which issued to Peter S. Kubik and is entitled "Integrated Circuit Extraction Tool." In the specification of the latter patent, mention is made of several patented extraction tools, each adapted for a particular purpose. None of the foregoing tools solves the problem of removal of the leadless IC packages used in the high package density island configuration of the reference Braun et al patent. The need existed for a simple, yet efficient, low-cost extraction tool which might be provided for servicing the island IC packages. The present invention fills this need.

SUMMARY OF THE INVENTION

In accordance with the present invention there is provided a tool for removal of an IC package from its mating connector. Prior to its final clamping into the connector by a hold-down device, the package is retained by a split plastic post within the connector. The top portion of this post is contracted to allow its passage through the registration hole in the package heat sink, and then permitted to expand to its original dimensions after the package is in place.

The tool assembly comprises a plunger and helical spring. The body is a one piece spring member with thin extending fingers having notches or cutouts to engage the opposite sides of the package heat sink. A plunger is supported by the body member. After the heat sink has been engaged, the plunger is depressed and contacts the split post, thereby applying a force to the top of the post. Simultaneously, an opposite force is applied to the heat sink by the tool body member. These opposing forces move the heat sink to the top of the post, where the plunger now contacts the heat sink. The opposing forces on the heat sink insure a firm grasp of the package, and the latter is easily removed with a slight pull. The helical spring provides a plunger return.

The present invention provides a highly effective tool characterized by simplicity and low cost of construction. A number of advantages accrue from the use of the tool including a self-locating feature, a positive controlled extraction of the package with minimal tool manipulation, and a positive grasp of the package but with ease of package release from the tool after removal from the connector.

These and other features and advantages of the invention will become more fully apparent in the detailed description of the tool and its mode of operation which follows.

DESCRIPTION OF THE PREFERRED EMBODIMENT

Figure 1:
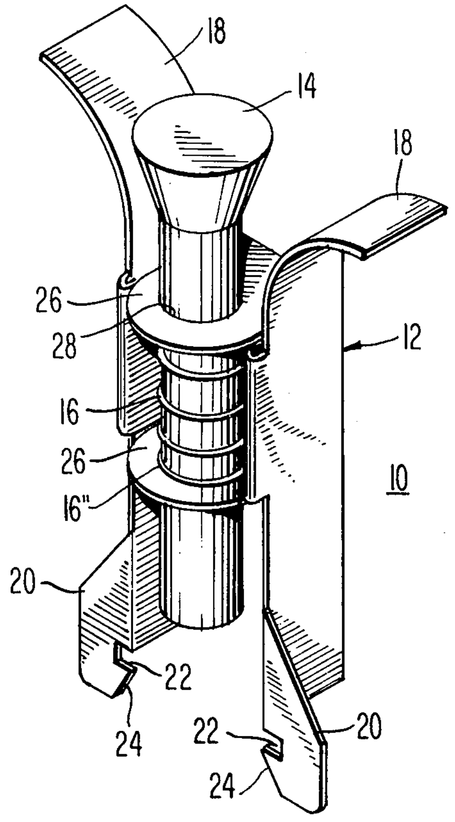
FIG. 1 is a pictorial view of the removal tool of the present invention.
Figure 2:
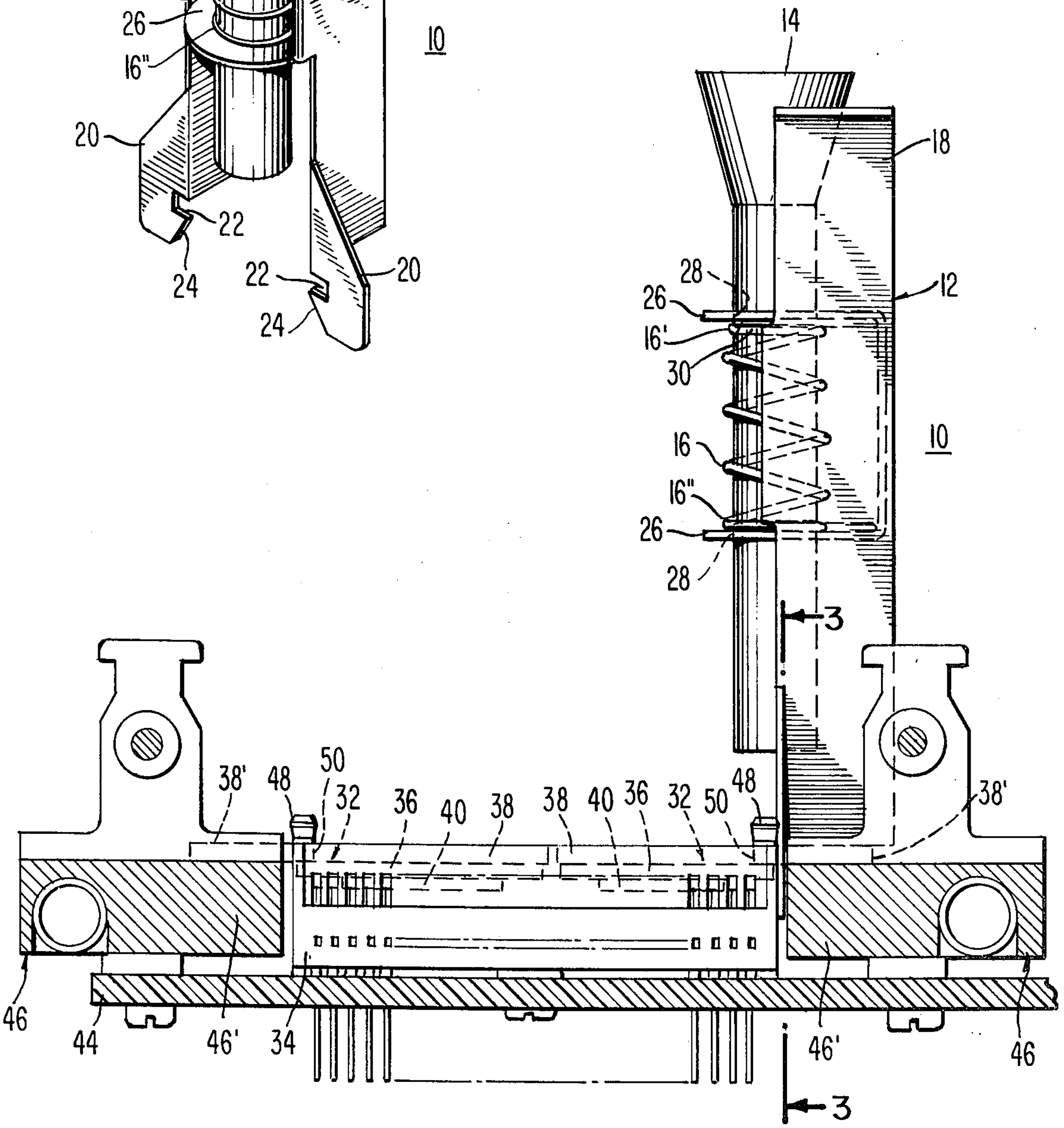
FIG. 2 depicts the engagement of the IC package heat sink by the fingers of the tool body while the package and its mating connector are in a fully assembled island configuration.
Figure 3:
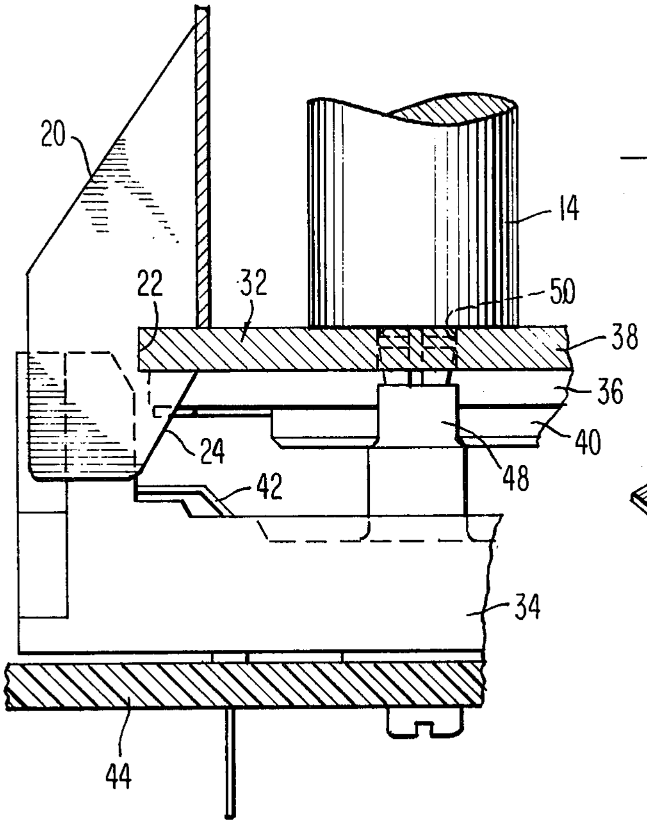
FIG. 3 is a partial section view taken along the lines 3—3 of FIG. 2 and depicts the contact of the tool plunger with the connector retention post during package removal.
Figure 4:
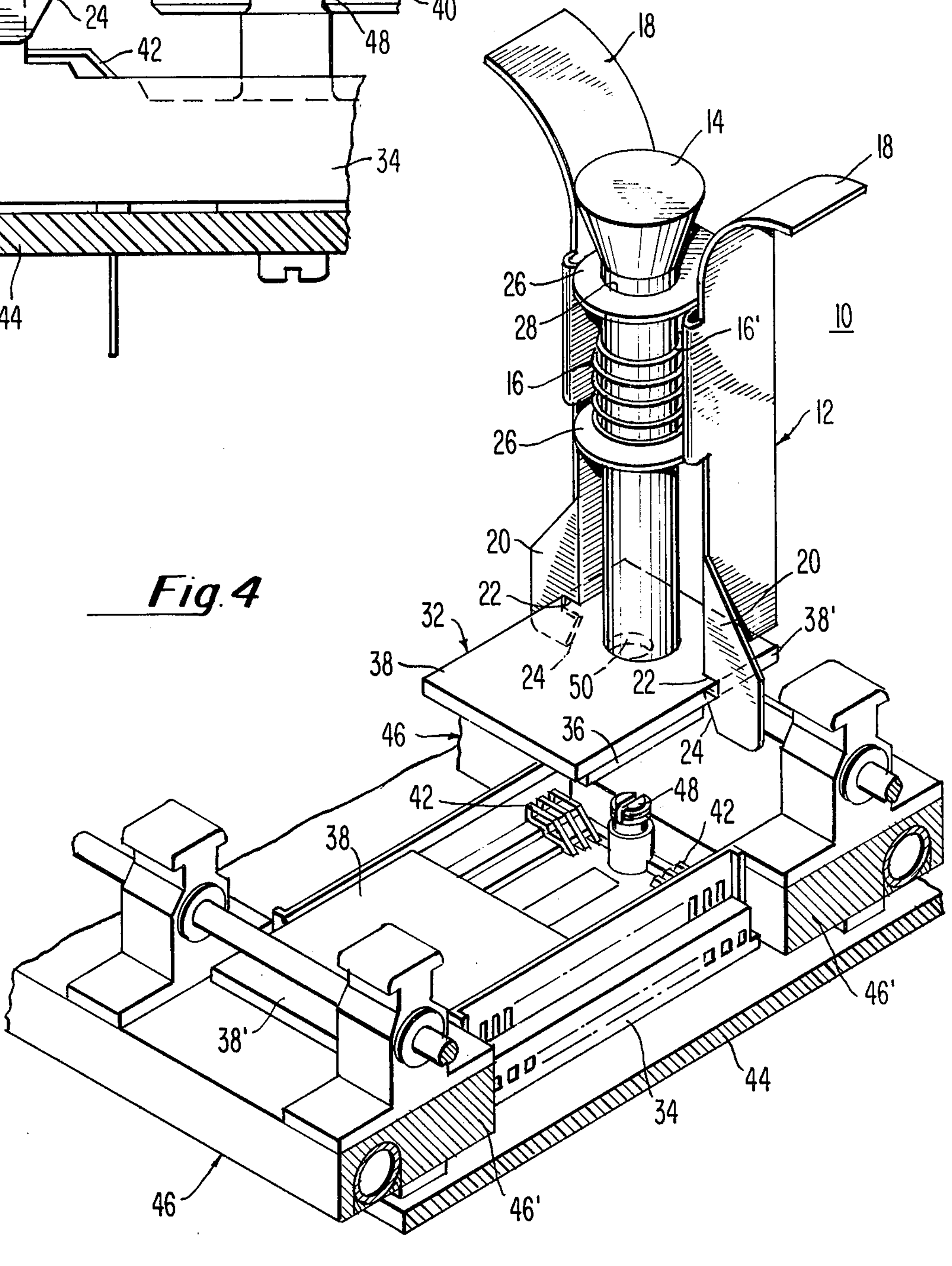
FIG. 4 illustrates the final stage of removal wherein the IC package has been fully grasped by the tool and is free from the connector.

A pictorial view of the removal tool 10 of the present invention appears in FIG. 1. The tool 10 is comprised of a three piece assembly, namely, a body 12, plunger 14 and helical spring 16. In an actual operative embodiment, the body 12 was formed from a single sheet of annealed spring steel. The side portions of the body 12 have in the upper extremities thereof respective curved or hook-like members 18, which are adapted to receive the fingers of the tool user. The lower parts of the side portions of body 12 terminate respectively in a pair of finger-like extensions 20, which project outward at right angles from the side portions of body 12. The extensions 20 are provided with respective notches or cutouts 22 to engage the opposite sides of the IC package heat sink member 38 (FIGS. 2, 3, 4). The lower inside edges 24 of the fingers 20 are chamfered to enable them to pass more easily over the package heat sink 38 as the tool is applied.

The central portion of the body 12 comprises a pair of spaced-apart parallel sections 26 lying in planes disposed at right angles to those of the body side portions and having substantially aligned apertures 28 of like-diameter therein. A plunger 14 which may be formed of plastic or nylon is slidably mounted within the apertures 28 of the sections 26 of the central body portion.

A helical spring 16 located between the sections 26 of the central portion of body member 12 encompasses the plunger 14. The latter has a circumferential groove 30 (as seen in FIG. 2) in the upper portion to retain the uppermost coil 16' of spring 16 which has a slightly reduced diameter compared with the other coils. The lower-most coil 16'' of spring 16 rests upon the lower section 26 of the central body portion.

FIGS. 2, 3 and 4 depict the operation of the tool in connection with IC packages in a fully assembled island configuration as described and claimed in the reference patent.

Before proceeding with the description of the removal operation itself, it may be helpful to describe the aforementioned island configuration. With reference to FIGS. 2, 3 and 4, a pair of integrated circuit packages 32, sometimes called a "split-package" configuration, are illustrated as being mountable in a receptacle or connector 34. It should be understood that a single larger IC package could also be mounted in connector 34 and that the present tool would be similarly effective in its removal. In either case the IC package is considered to be of the leadless variety. The package 32 may utilize a ceramic body 36 (FIG. 3) having a silicon chip (not shown) hermetically sealed in a cavity formed therein. The internal leads of the package for providing access to the chip are adhered to a layer of glass fused to the ceramic body 36. A heat sink member 38 is fused to the entire lower surface of the ceramic body 36. The heat sink member 38 has an integral extension 38' from at least one of its extremities. A lid or cover 40 which may be of ceramic or a suitable metal alloy protects the integrated circuit chip.

In order to make electrical contact with the terminal portion of the integrated circuit leads, connector 34 is provided. The connector comprises a molded body of insulative material and a plurality of electrical contacts 42, one for each of the package terminals. The connector is affixed to an interconnection board 44, and is located between parallel spaced-apart sections 46' of the island cooling frame 46. Each connector 34 has at respective opposite extremities thereof a pair of package alignment and retention posts 48. In order to insert the IC package 32 into the connector, the split top on the associated post 48, is gently pressed together in order that the pin may be inserted through the hole 50 (FIGS. 3, 4) provided in the IC package heat sink 38. This arrangement serves to prevent the inadvertent dislodgement of the package from the connector, particularly when in a fully assembled condition the force exerted upon the packages by a hold-down spring (not shown in the drawings) is suddenly released. At the same time, the retention forces provided by posts 48 together with the close proximity of the connector extremities to the cooling frame sections 46' inhibit the removal of the IC packages 32.

With general references to FIGS. 2, 3 and 4, and particular reference to FIG. 2, the IC packages 32 are shown installed in connector 34. The respective extensions 38' of the package heat sink member 38 are in contact with sections 46' of the cooling frame 46. Initially, the body 12 of the tool was held over the IC package 32 with the chamfered sections 24 of the extending fingers 20 placed on top of the heat sink 38 at the point where a slit exists between the connector 34 and the section 46' of the cooling frame adjacent thereto. Since the longitudinal center line of the plunger 14 lies substantially in the plane passing through the finger extensions 20, and the diameter of the plunger 14 is larger than that of the connector retention post 48, it is unnecessary to orient the tool itself with respect to the package. This means that the user when positioning the tool 10 over the heat sink 38 is not concerned with whether the side portions of the tool body will ultimately contact the part of the heat sink 38 lying over the connector 34 or the cooling frame sections 46'. While still holding the body of the tool, a force is applied perpendicular to the package heat sink. The initial separation of the extending fingers is slightly less than the width of the heat sink. As the fingers 20 descend beyond the top surface of the heat sink aided by the chamfered surfaces 24 thereof, the side portions of the body are deflected outward, until reliefs are provided in the form of cutouts 22, thereby permitting the body side portions to snap back to their initial position. This is the condition illustrated in FIG. 2 wherein opposite edges of the heat sink 38 are disposed within the cutouts 22 of the tool fingers 20.

With particular reference to FIG. 3, the user of the tool may place the index and second finger in the respective hook-like members of the tool body and simultaneously depress with the thumb, the plunger 14 until it contacts connector post 48. This action causes a force to be applied to the post 48, while a force opposite in sense is applied to the heat sink 38 via fingers 20. These opposing forces result in the movement of the IC package 32 with respect to connector 34 such that the top of the heat sink 38 is now flush with the top of the connector post 48. This condition is illustrated in FIG. 3.

Plunger 14 continues to be depressed and since, as mentioned previously, the diameter of the plunger is substantially larger than post 48, it contacts the heat sink 38 and the opposing forces are now applied to the heat sink member itself. This results in a firm grasp of the IC package. A slight force, or pull, will complete the extraction with the package retained in the tool as shown in FIG. 4. The plunger 14 may then be released, and the helical spring 16 which had been in compression while the plunger 14 was depressed, returns the plunger to its original position. The IC package 32 may then be easily slid from between the finger cutouts 22 and removed from the tool.

In conclusion, it is apparent that the tool disclosed herein offers a simple, economical, timesaving means to facilitate the removal of integrated circuit packages from a high density configuration. The inventive concepts and implementation described herein are directed to a specific application. In other applications, changes and modifications of the tool may be needed to suit particular requirements. Such variations as are within the skill of the designer, and which do not depart from the true scope and spirit of the invention are intended to be covered by the following claims.

What is claimed is:

1. A tool for use in removing from a connector an integrated circuit package having a metallic heat sink member extending beyond an end of said connector and including a registration aperture, said connector having a retention post for engaging said registration aperture, said tool comprising:

a body member, said body member having a pair of spring-like parallel spaced-apart side portions, said side portions including at one extremity thereof a respective pair of thin finger-like extensions angularly disposed with respect thereto, said finger-like extension having respective cutouts for engaging the opposite edges of said integrated circuit package heat sink member, said side portions being curved respectively at the other extremity thereof, said body member further including a central portion disposed between and connecting said side portions, said central portion comprising a pair of parallel spaced-apart sections lying in planes oriented at right angles to those of said side portions, said last mentioned sections having respective like-diameter apertures therein in substantial alignment with each other, a plunger, said plunger being slidably mounted within the apertures of said sections of the central portion of said body member and positioned to initially contact said connector retention post in order that a force may be applied thereto, said curved side portions of said body member permitting an opposite force to be applied via said finger-like extensions to said heat sink member, the simultaneous application of said opposing forces resulting in the movement of said package relative to its connector, and upon the transfer of contact by said plunger from said retention post to the surface of said heat sink member, the firm grasping of said package to accomplish its removal.

2. An integrated circuit package removal tool as defined in claim 1 further including a helical spring positioned between said sections of said central portion of said body member and encompassing said plunger, said plunger having a circumferential groove for retaining the coil at one extremity of said spring, the coil at the other extremity of said spring being restrained by one of said sections of said central body portion.

3. An integrated circuit package removal tool as defined in claim 2 further characterized in that said portions of said body member are spaced apart by a distance which is less than the width of said heat sink member, said finger-like extensions having respective chamfered inside edges to facilitate the passage of the tool over said heat sink member prior to the engagement of the latter by said cutouts.

4. An integrated circuit package removal tool as defined in claim 3 wherein said finger-like extensions are oriented at right angles to the respective side portions of said body member, said extensions being disposed during application of said tool in contiguity with the end of said connector underlying the extension of said heat sink member.

5. An integrated circuit package removal tool as defined in claim 4 further characterized in that the diameter of said plunger is substantially larger than the diameter of said connector retention post and that of said package registration aperture.

6. An integrated circuit package removal tool as defined in claim 5 further characterized in that the longitudinal center line of said plunger lies substantially in a plane through said finger-like extensions, the geometrical center of said plunger being offset from that of said retention post during application of said tool, whereby said tool is insensitive to the direction of its body member with respect to said package.

7. An integrated circuit package removal tool as defined in claim 6 further characterized in that said body member is constructed in one piece of spring steel and said plunger is constructed of nylon.

* * * * *